United States Patent [19]

Enomoto

[11] 4,031,430
[45] June 21, 1977

[54] VERTICAL DEFLECTION CIRCUIT

[75] Inventor: Shigeru Enomoto, Kyoto, Japan

[73] Assignee: Matsushita Electric Industrial Co., Ltd., Osaka, Japan

[22] Filed: Nov. 12, 1975

[21] Appl. No.: 631,460

[30] Foreign Application Priority Data

Nov. 13, 1974  Japan .................. 49-131489
Dec. 5, 1974   Japan .................. 49-140277
Feb. 13, 1975  Japan .................. 50-18520

[52] U.S. Cl. .................. 315/403; 315/397
[51] Int. Cl.$^2$ .................. H01J 29/70; H01J 29/76
[58] Field of Search .......... 315/396, 403, 407, 397

[56] References Cited

UNITED STATES PATENTS 3,456,150  7/1969  Attwood ............... 315/403
3,939,380  2/1976  Peer .................. 315/407

Primary Examiner—Maynard R. Wilbur
Assistant Examiner—T. M. Blum
Attorney, Agent, or Firm—Wenderoth, Lind & Ponack

[57] ABSTRACT

This invention relates to improvements in a vertical deflection circuit employing a class D amplifier. The circuit comprises a pulse width modulator for converting a sawtooth waveform signal to a width modulated pulse train, a switch mode power amplifier for amplifying said width modulated pulse train, a demodulating filter circuit for demodulating said width modulated pulse train to the sawtooth waveform, a damping circuit for preventing a significant power loss in said demodulating filter circuit and a deflection yoke coupled to said demodulating filter circuit, thereby making it possible to reduce power dissipation in the circuit.

5 Claims, 7 Drawing Figures

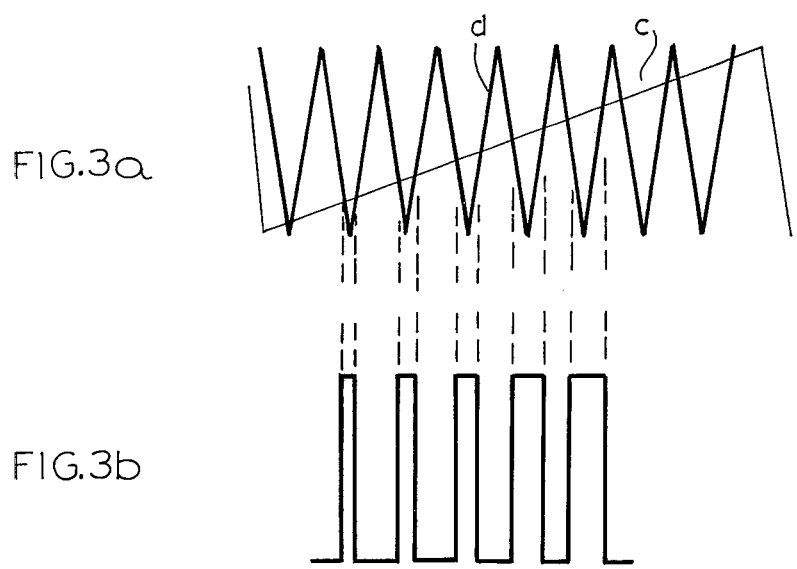
FIG.3a
FIG.3b
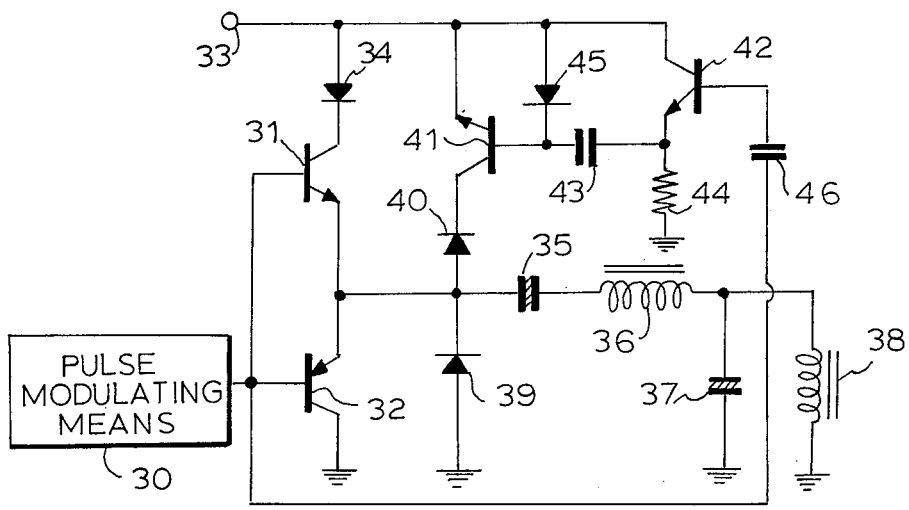
FIG.4

VERTICAL DEFLECTION CIRCUIT

BACKGROUND OF THE INVENTION

The invention relates to a vertical deflection circuit for use in television receivers.

A television receiver employs a vertical deflection circuit to accomplish field scanning on a cathode ray tube. In many cases, an output stage of such a circuit has a class A configuration or a class B configuration. In general, class B configuration has higher power efficiency than a class A configuration, which efficiency is the ratio of power dissipation in deflection yoke to a total input in the vertical deflection circuit. A theoretical power efficiency in a vertical deflection circuit having a class B configuration in its output stage is about 67%. Due to a flyback pulse induced in a retrace period, however, power efficiency in a practical circuit is very low, being on the order of about 20%.

Recently, a vertical deflection circuit having class D configuration which has much higher power efficiency has been introduced. The circuit is minutely disclosed in U.S. Pat. No. 3,456,150. The circuit comprises pulse width modulation means where an input sawtooth waveform is modulated and converted to higher frequency pulses the width of which varies periodically, switch mode amplifying means which amplifys said width modulated pulses, demodulating means which converts the amplified signal of said width modulated pulses to the desired sawtooth waveform and a deflection yoke as a load for the circuit. Theoretical power efficiency of such a circuit is 100% because said amplifying means is operated in the switch mode. Power efficiency in a practical application of this circuit, however, is much lower than said theoretical efficiency due to power loss in the demodulating means.

SUMMARY OF THE INVENTION

Accordingly, it is an object of the present invention to provide a vertical deflection circuit having a class D configuration which makes it possible to reduce power dissipation therein.

This object is achieved by the circuit of the present invention, which comprises a modulation means for converting an input sawtooth waveform having a field frequency into a width modulated pulse train having a higher frequency than said field frequency, power amplification means coupled to the modulating means for supplying enough power to a deflection yoke, demodulating means coupled to the power amplification means for filtering said width modulated pulse train and providing the sawtooth waveform, and the deflection yoke coupled to the demodulating means. The circuit further includes recovering means for recovering stored energy in the demodulating means and supplying it to a supply source so as not to dissipate it in the demodulating means, and also includes a switching means coupled to the power amplification means for preventing a flyback pulse from being clamped to the supply source voltage during a retrace period in the field frequency. These circuit configurations of the present invention reduce power loss in the demodulating means, thus resulting in improvement of the power efficiency thereof, and provide a desired retrace period.

Other features and advantages of this invention will be apparent from the following description taken in connection with the accompanying drawings.

BRIEF DESCRIPTION OF THE DRAWING

FIGS. 3a and 3b show waveforms for explaining the operation of a pulse width modulation method;

FIG. 4 is a circuit diagram showing an embodiment of the vertical deflection circuit according to the present invention.

DESCRIPTION OF THE PREFERRED EMBODIMENT

Figure 1:
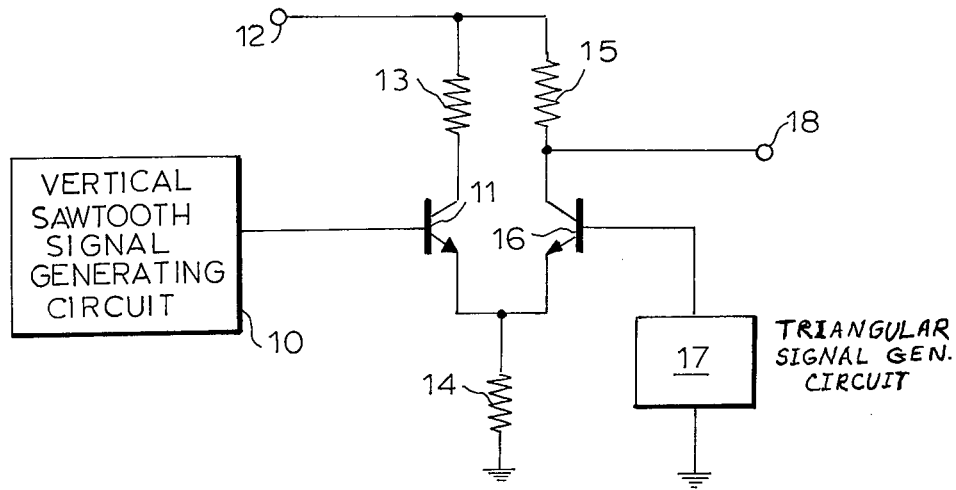
FIG. 1 is a circuit diagram for explaining a pulse width modulation method according to the prior art.
Figure 2:
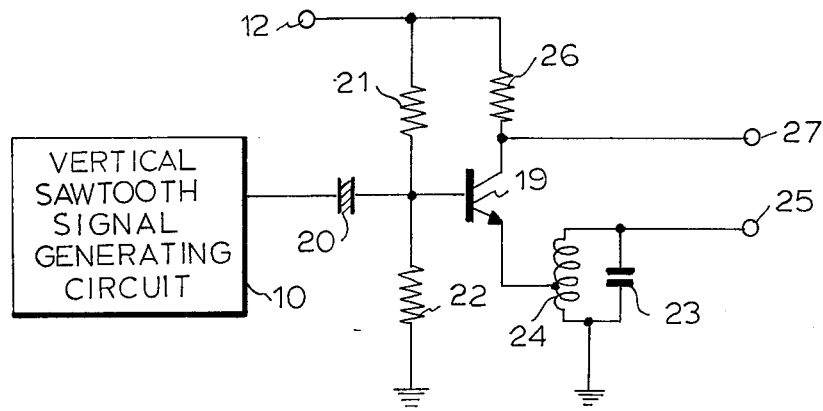
FIG. 2 is another circuit diagram for explaining a pulse width modulation method according to the prior art.

FIG. 1, which is partly in block diagram form and partly schematic, represents a pulse width modulating means. FIG. 2 shows another arrangement of such means illustrated in the same manner.

In FIG. 1, a vertical sawtooth signal generating circuit 10 for generating a sawtooth waveform signal which has a field frequency is coupled to the base of a transistor 11. A voltage (+B) source 12 is coupled to the collector electrode of transistor 11 through a resistor 13, and the emitter electrode of transistor 11 is coupled to ground through a resistor 14. In addition, the voltage (+B) source 12 is coupled to the collector electrode of a transistor 16 through a load resistor 15, which collector electrode is coupled to the emitter electrode of the transistor 11 so that those two transistors are in a differential amplifying circuit configuration. Triangular signal generating circuit 17 for generating a triangular waveform signal is coupled to the base electrode of transistor 16, which triangular waveform signal has a higher frequency (e.g. horizontal deflection frequency of 15750 herz) than that of the sawtooth waveform signal from vertical sawtooth signal generating circuit 10.

In this pulse width modulating means, the voltage of the coupled point of emitter electrodes of transistor 11 and transistor 16 increases in proportion to the increase of the voltage of the sawtooth waveform signal. This is illustrated in FIG. 3a. The voltage waveform C in FIG. 3a represents the emitter voltage of transistor 11 and transistor 16, while voltage waveform d of FIG. 3a is the base voltage waveform of transistor 16. During the period that the base voltage of transistor 16 is higher than the emitter voltage of the transistor, the transistor 16 is conductive, and during the remainder of the time the transistor is nonconductive. Consequently, the output voltage waveform at a terminal 18, which is coupled to the collector electrode of transistor 16 in FIG. 1 is a width modulated pulse train as is shown in FIG. 3b.

FIG. 2 shows another arrangement of a pulse width modulating means. In FIG. 2, a sawtooth waveform signal generating circuit 10 is coupled to the base electrode of a modulating transistor 19 through a coupling capacitor 20. A resistive voltage divider comprising a resistor 21 and a resistor 22 is coupled between the voltage (+B) source 12 and ground and the coupling point of the voltage divider is coupled to the base electrode of transistor 19. A resonant circuit comprising a capacitor 23 and a coil 24 having a tapped winding is coupled between pulse input terminal 25 and ground. The tapped terminal of the coil 24 is then coupled to the emitter electrode of transistor 19. A load resistor 26 is coupled between the collector electrode of transistor 19 and the voltage (+B) source 12, and the collector electrode of transistor 19 is coupled to an output terminal 27. In the circuit arrangement shown in FIG. 2, a sinusoidal signal which has a frequency higher than that of the sawtooth input signal of the vertical sawtooth signal generating circuit 10 in order to be able to sampling theorem, is generated in the resonant circuit by a trigger input signal supplied thereto through the terminal 25. The emitter electrode of transistor 19 is oscillated by the sinusoidal voltage. Hence comparing it with the voltage of the base electrode of transistor 19 which varies in the manner of a sawtooth waveform, the transistor 19 repeats a conductive condition and a nonconductive condition alternatively. Thus, at the output terminal 27 of this circuit, a width modulated pulse train illustrated in FIG. 3b is obtained.

Either the circuit shown in FIG. 1 or that shown in FIG. 2 is represented by a block 30 in FIG. 4 which shows one embodiment of the present invention. The block 30 may include pulse amplifying means. The width modulated pulse train is transmitted to the bases of complementarily connected transistors 31 and 32. A voltage (+B) source 33 is coupled to the collector electrode of n-p-n transistor 31 through a forward coupled diode 34. Commonly connected emitter electrodes of transistors 31 and 32 are coupled to a filtering choke 36, through a decoupling capacitor 35, which filtering choke forms a demodulating means together with a capacitor 37, one end of which is connected to the filtering choke 36. The other end of the capacitor 37 is grounded. The collector electrode of p-n-p transistor 32 is also grounded. A vertical winding of a deflection yoke 38 is coupled between the junction of the choke 36 and the capacitor 37 and ground. A damping diode 39 is reversely coupled in parallel with the transistor 32. Another damping diode 40 is coupled between the emitter electrode of transistor 31 and the collector electrode of switching n-p-n transistor 41. The emitter electrode of transistor 41 is coupled to voltage (+B) source. The collector electrode of another switching transistor 42 is coupled to the voltage (+B) source, and the emitter electrode of transistor 42 is coupled to the base electrode of transistor 41 through a storing capacitor 43. Furthermore, the emitter electrode of transistor 42 is coupled to ground through a resistor 44. Voltage (+B) source is coupled to the base electrode of transistor 41 through a forward biased diode 45. The base electrode of transistor 42 is coupled to the base electrodes of transistors 31 and 32 through a capacitor 46.

In the circuit shown in FIG. 4, a width modulated pulse train is supplied to the base electrodes of transistors 31 and 32 so that one of them is conductive while the other is nonconductive. When the transistor 31 is conductive, current flows from the voltage (+B) source to ground through the diode 34, the transistor 31, the decoupling capacitor 35, the filter choke 36 and the capacitor 37. The energy is stored in the capacitor 37. Due to the inductance of the choke 36 the current increases, and when the transistor 31 becomes nonconductive, transistor 32 becomes conductive. However the current flowing in choke 36 tends to continue to flow in the same direction. Thus the current caused by the energy stored in the choke 36 flows through the capacitor 37, the damping diode 39, and the capacitor 35. Then, this current decreases. When this current becomes zero, reverse current starts to flow from the capacitor 37 through the choke 36, the coupling capacitor 35 and the transistor 32 and the current increases. When the transistor 32 becomes nonconductive, the transistor 31 becomes conductive. However the current tends to flow in the same direction, with the amount thereof decreasing, continuing to flow through the capacitor 35, the damping diode 40 and the transistor 41. The reason why the transistor 41 is conductive at this time is as follows. When the transistor 32 is conductive, the voltage of the base electrodes of transistors 31 and 32 is low. Therefore, transistor 42 is not driven and is nonconductive. Thus, the voltage (+B) source charges the capacitor 43 through the forward biased diode 45 and the resistor 44. The base voltage of transistor 41 is almost equal to the +B voltage. However, because the emitter voltage of the transistor 41 is also B+ voltage, transistor 41 is nonconductive. When the input pulse added to the base electrodes of both transistor 31 and 32 becomes high, the transistor 31 becomes conductive and the pulse drives the transistor 42 through the capacitor 46 and renders it conductive. Then the base voltage of the transistor 41 jumps up to almost twice the (+B) voltage, because the charged voltage of capacitor 43 is added to the (+B) voltage caused by the conductive transistor 42. This causes the transistor 41 to become conductive. As a result, as described above, current can flow through the capacitor 35, the diode 40 and the transistor 41.

When the current ceases, current through the diode 34, the transistor 31, the capacitor 35, the choke 36 and the capacitor 37 starts to flow again. This cycle is repeated.

However, because the input pulse train is width modulated stored energy in the capacitor 37 is not completely recovered and the remaining energy increases gradually and this forms the periodical sawtooth waveform. This means the width modulated pulses are demodulated. The demodulated sawtooth voltage is supplied to the deflection yoke 38 causing a current having a sawtooth waveform with a vertical deflection period.

While in the flyback period of vertical deflection, a flyback pulse induced by the deflection yoke 38 should not be clamped to the (+B) voltage. If it is clamped, stored energy in the deflection yoke 38 in the trace period is not recovered and causes an undesirably long retrace period. The reason why the flyback pulse in the circuit shown in FIG. 4 is not clamped is as follows. In the period when the voltage of the bases of the transistors 31 and 32 is high and the transistor 31 is conductive, this causes the flyback pulse to be clamped. However if the flyback pulse tends to rise to more than the (+B) voltage, the diode 34 becomes reverse biased and this prevents this circuit from exerting a clamping action on the flyback pulse. Therefore, although because of the high voltage level of the bases of both transistor 31 and 32 the transistor 42 and 41 becomes conductive, stored energy in the capacitor 43 flows back to the voltage (+B) source immediately through the base and the emitter path of the transistor 41 because of the small capacitance of the capacitor 43. Transistor 41 turns nonconductive. This interrupts the path through the choke 36, the capacitor 35, the diode 40 and the transistor 41. This is because the flyback period of vertical deflection which is about 800 micro seconds is much longer than the maximum width of the modulated pulse period which, for example, is 63 micro seconds in the case of being modulated by horizontal frequency. Thus, the flyback pulse is not clamped to (+B) supply voltage and it is oscillated freely.

In the circuit arrangement shown in FIG. 4, it is obvious that there is no power loss except a very small power loss such as loss in the resistor 44, the resistive component of choke 36 and the switching loss in the semi-conductors which is also small. Therefore, the power efficiency is improved.

An example of practical values and components for the arrangement shown in FIG. 4 is as follows;

| | |
|---|---|
| voltage of voltage (+B) sources 33 | 15 volts |
| transistor 31 | 2SC1317 |
| transistor 32 | 2SA719 |
| transistor 41 and 42 | 2SC828A |
| diode 34, 39, 40 and 45 | MA162 |
| capacitor 35 | 1000 μF |
| capacitor 43 | 0.15 μF |
| capacitor 37 | 1 μF |
| capacitor 46 | 0.022 μF |
| resistor 44 | 820 ohms |
| choke 36 | 1.2 mH |

Figure 5:
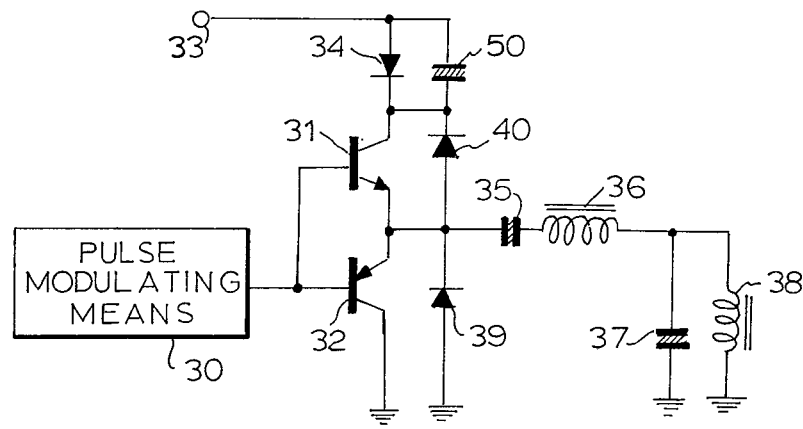
FIG. 5 and FIG. 6 are circuit diagrams showing other embodiments of the present invention.
Figure 6:
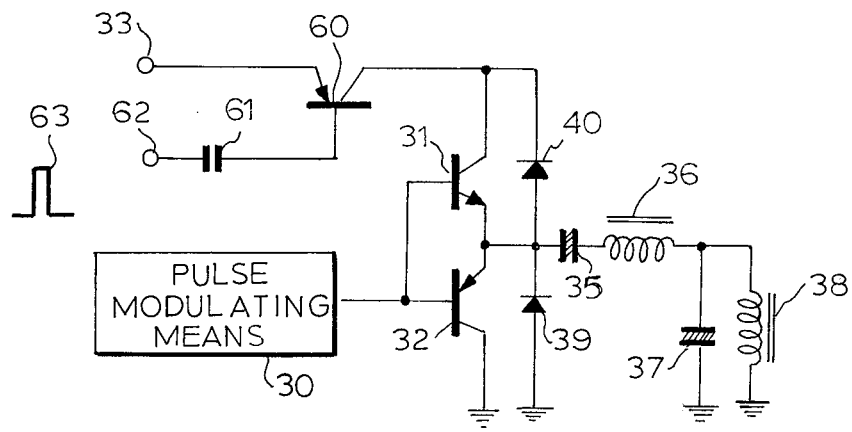

The switching circuit comprising the transistors 41 and 42, the diode 45, the capacitors 43 and 46, and the resistor 44 in FIG. 4 may be replaced with a capacitor 50 as is shown in FIG. 5 or with a circuit comprising a transistor 60 and a capacitor 61 as is shown in FIG. 6.

In FIG. 5, the impedance of capacitor 50 is low for the modulating frequency and is high for the vertical flyback frequency. Therefore, the current flowing through the diode 40 can pass through the capacitor 50 during the trace period in said field frequency; however, during the vertical flyback period in said field frequency the current can not pass the capacitor 50 because the frequency of the flyback pulse is lower than the modulating frequency. Thus, the vertical flyback pulse is free from being clamped to the (+B) voltage.

In FIG. 6 a vertical synchronizing pulse or vertical flyback pulse 63 is supplied to a terminal 62 so that the transistor 60 is conductive during the vertical trace period and is nonconductive during the vertical flyback period. Therefore, the current flowing through the diode 40 can pass through the transistor 60 during the vertical trace period and the vertical flyback pulse is free from being clamped to the (+B) voltage.

Thus, a desirable retrace period can be achieved.

As many apparently widely different embodiments of this invention may be made without departing from the spirit and scope thereof, it is to be understood that this invention is not limited to the specific embodiments thereof except as defined in the applied claims.

What is claimed is:

1. A vertical deflection circuit employing a class D amplifier comprising:
    modulating means for converting a sawtooth waveform signal having a field frequency to a width modulated pulse train;
    a pulse amplifier coupled to said modulating means for amplifying said width modulated pulse train, said pulse amplifier comprising an output circuit having a pair of switching devices which are connected in series and also connected for making one of them conductive while the other is nonconductive, two damping diodes each being connected in parallel with a corresponding switching device and reversely with respect to current flow through the switching devices, switching means connected in series with one of said damping diodes and which is nonconductive during a retrace period in said field frequency, and a forwardly biased diode coupled between one of said switching devices and a voltage supply source;
    demodulating means for demodulating said width modulated pulse train to said sawtooth waveform, said demodulating means being composed of a filtering choke, a decoupling capacitor, one end of said choke being coupled to the connection between said switching devices through said decoupling capacitor, and a further capacitor coupled between the other end of the filtering choke and ground; and
    a deflection yoke winding coupled between the connecting point between the filtering choke and said further capacitor, and ground.

2. A vertical deflection circuit according to claim 1 wherein said switching devices are complementary transistors.

3. A vertical deflection circuit according to claim 6 wherein said switching means is a capacitor.

4. A vertical deflection circuit employing a class D amplifier comprising:
    modulating means for converting a sawtooth waveform signal having a field frequency to a width modulated pulse train;
    a pulse amplifier coupled to said modulating means for amplifying said width modulated pulse train, said pulse amplifier comprising an output circuit having a pair of switching devices which are connected in series and also coupled for making one of them conductive while the other is nonconductive, two damping diodes connected in parallel with corresponding switching devices and reversely with respect to current flow through the switching devices, switching means coupled between a voltage supply source and the connecting point between one of said switching devices and the corresponding damping diode for being rendered nonconductive during a flyback period in said frequency;
    demodulating means for demodulating said width modulated pulse train to said sawtooth waveform, said demodulating means being composed of a filtering choke, a decoupling capacitor, one end of said choke being coupled to the connection between said switching devices through said decoupling capacitor, and a further capacitor coupled between the other end of the filtering choke and ground; and
    a deflection yoke winding coupled between the connecting point between the filtering choke and said further capacitor, and ground.

5. A vertical deflection circuit according to claim 4 wherein said switching devices are complementary transistors.

* * * * *